(12) United States Patent
Li et al.

(10) Patent No.: US 11,791,822 B2
(45) Date of Patent: Oct. 17, 2023

(54) PROGRAMMABLE DEVICE FOR PROCESSING DATA SET AND METHOD FOR PROCESSING DATA SET

(71) Applicant: THE FOURTH PARADIGM (BEIJING) TECH CO LTD, Beijing (CN)

(72) Inventors: Jiashu Li, Beijing (CN); Mian Lu, Beijing (CN); Cheng Ji, Beijing (CN); Jun Yang, Beijing (CN)

(73) Assignee: THE FOURTH PARADIGM (BEIJING) TECH CO LTD, Beijing (CN)

( * ) Notice: Subject to any disclaimer, the term of this patent is extended or adjusted under 35 U.S.C. 154(b) by 120 days.

(21) Appl. No.: 17/619,142

(22) PCT Filed: Jun. 12, 2020

(86) PCT No.: PCT/CN2020/095907
§ 371 (c)(1),
(2) Date: Dec. 14, 2021

(87) PCT Pub. No.: WO2020/249106
PCT Pub. Date: Dec. 17, 2020

(65) Prior Publication Data
US 2022/0149843 A1    May 12, 2022

(30) Foreign Application Priority Data
Jun. 14, 2019  (CN) .......................... 201910516213.2

(51) Int. Cl.
*H03K 19/177* (2020.01)
*G06F 7/50* (2006.01)
(52) U.S. Cl.
CPC ............. *H03K 19/177* (2013.01); *G06F 7/50* (2013.01)

(58) Field of Classification Search
None
See application file for complete search history.

(56) References Cited

U.S. PATENT DOCUMENTS

| 6,370,556 B1 * | 4/2002 | Saramaki | ............... | H03H 17/06 708/319 |
|---|---|---|---|---|
| 2013/0297666 A1 | 11/2013 | Chen et al. | | |

(Continued)

FOREIGN PATENT DOCUMENTS

| CN | 1399423 A | 2/2003 |
|---|---|---|
| CN | 101950250 A | 1/2011 |

(Continued)

OTHER PUBLICATIONS

Pengcheng Yao,"An Efficient Graph Accelerator with Parallel Data Conflict Management", Huazhong University of Science and Technology, Jun. 3, 2018.

*Primary Examiner* — Jany Richardson
(74) *Attorney, Agent, or Firm* — Bridgeway IP Law Group, PLLC; Sang Ho Lee; Hyun Woo Shin

(57) ABSTRACT

Provided are a programmable device for processing a data set, and a method for processing a data set. The programmable device includes a plurality of accumulation circuits, wherein each of the accumulation circuits includes a pipeline adder and a cache unit for storing a computation result of the pipeline adder; and a multiplexer for receiving in sequence data in a data set, dynamically determining a correlation between a plurality of features included in the data and the plurality of accumulation circuits, and respectively sending, according to the correlation, feature values of the plurality of features in the received data to corresponding accumulation circuits.

20 Claims, 5 Drawing Sheets

(56) References Cited

U.S. PATENT DOCUMENTS

| | | | |
|---|---|---|---|
| 2014/0029851 A1 | 1/2014 | Tai et al. | |
| 2015/0143077 A1* | 5/2015 | Khan | G06F 9/3897 712/7 |
| 2016/0026607 A1 | 1/2016 | Codrescu et al. | |
| 2018/0340787 A1 | 11/2018 | Sheth et al. | |
| 2021/0167944 A1* | 6/2021 | Kalistru | G06F 5/10 |

FOREIGN PATENT DOCUMENTS

| | | |
|---|---|---|
| CN | 104102470 A | 10/2014 |
| CN | 105723333 A | 6/2016 |
| CN | 108108150 A | 6/2018 |
| CN | 110245756 A | 9/2019 |

\* cited by examiner

PROGRAMMABLE DEVICE FOR PROCESSING DATA SET AND METHOD FOR PROCESSING DATA SET

This application is based on and claims priority to Chinese patent application No. 201910516213.2, filed on Jun. 14, 2019, entitled "Programmable device for processing data set and method for processing data set", the entire content of which is incorporated herein by reference.

FILED

The present disclosure relates to a programmable device for processing a data set and a method for processing a data set.

BACKGROUND

With the development of machine learning algorithms, in the specific implementation of machine learning algorithms (for example, Gradient Boosting Decision Tree, GBDT), processing node splitting is a step that consumes a lot of running time, and the overall running time of the GBDT algorithm depends on this. Among many algorithms (such as the histogram algorithm) for processing node splitting, pipeline optimization is a common parallel optimization method in hardware acceleration. Pipeline optimization divides complex processing operations into multiple steps, and by overlapping the operations on various steps, the operations can be executed in parallel, which greatly improves the running speed of the entire program and effectively improves the efficiency of hardware resources.

In the prior art, in order to perform the pipeline optimization of the accumulation operation in the GBDT histogram algorithm, an accumulator is commonly employed to solve the problem of data dependence (data conflict) due to the pipeline optimization. However, due to the limitations of resources (for example, greater than 20,000 independent accumulation requirements) and precision (for example, 64-bit double-precision floating-point), in the hardware acceleration implementation of the GBDT histogram algorithm, dedicated accumulators cannot be employed directly to perform the accumulation operation. Therefore, the optimization method by using dedicated accumulators to perform accumulation operation is limited.

SUMMARY OF THE INVENTION

The present disclosure provides a programmable device for processing a data set and a method for processing a data set.

An aspect of the present disclosure provides a programmable device for processing a data set, which includes a plurality of accumulator circuits, each of which comprises a pipeline adder and a buffer unit for storing the calculation results of the pipeline adder; and a multiplexer, configured to sequentially receive data in the data set, dynamically determine a correspondence between a plurality of features contained in the data and the plurality of accumulator circuits, and send feature values of the plurality of features in the received data to a corresponding accumulator circuit according to the correspondence, respectively.

Another aspect of the present disclosure provides a method for processing a data set based on a programmable device, which includes configuring a plurality of accumulator circuits in the programmable device, wherein each of the plurality of accumulator circuits comprises a pipeline adder and a buffer unit for storing the calculation results of the pipeline adder; and configuring a multiplexer in the programmable device, wherein the multiplexer sequentially receives data in the data set, dynamically determines a correspondence between a plurality of features contained in the data and the plurality of accumulator circuits, and, during each clock cycle, sends feature value of each of the plurality of features to a corresponding accumulator circuit according to the correspondence.

According to one or more aspects of the present disclosure, the multiplexer dynamically determines the correspondence between the plurality of features contained in the received data and the plurality of accumulator circuits, so as to avoid/reduce the accumulator circuit is assigned to the same feature again during the accumulation period on the feature values of a particular feature, thereby avoiding/reducing the occurrence of data conflicts.

Additional aspects and advantages of the present disclosure will be set forth in part in the description which follows and, in part, will be apparent from the description, or may be learned by practice of the invention.

DRAWINGS

The above and other features and characteristic of the present disclosure will become more apparent by the following description in conjunction with the accompanying drawings that exemplarily show an example, in which.

DETAILED DESCRIPTION OF THE EMBODIMENTS

Hereinafter, embodiments of the present disclosure will be described in detail with reference to the accompanying drawings. It should be noted here that "at least one of several items" appearing in the present disclosure means to include "any one of the several items", "a combination of any multiple of the several items", The three categories of "the totality of the several items" are in parallel. For example, "including at least one of A and B" includes the following three parallel situations: (1) including A; (2) including B; (3) including A and B. For another example, "perform at least one of step one and step two" means the following three parallel situations: (1) perform step one; (2) perform step two; (3) perform steps one and two.

In order to solve the limitations of the accumulator in terms of resources and accuracy, the present disclosure employs a combination of adders (e.g., single- or double-precision adders) and caches (e.g., Block RAM) to form an accumulator circuit.

Figure 1:
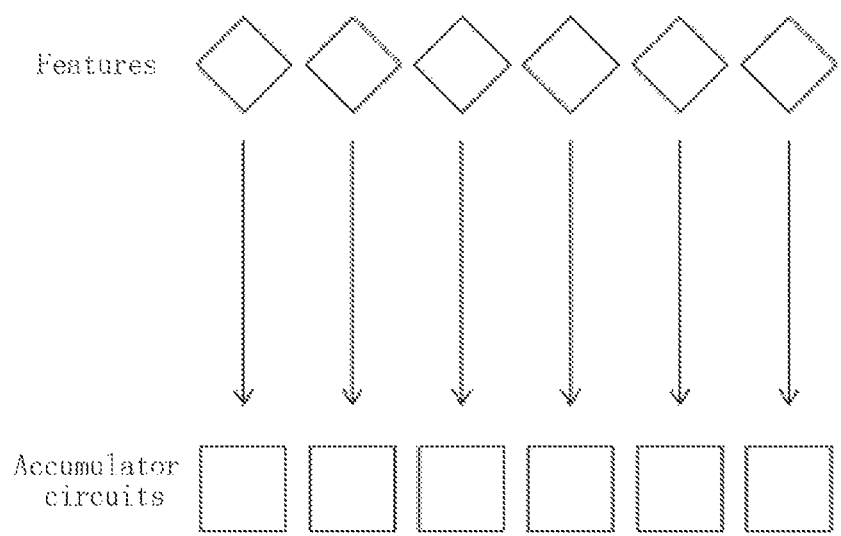
FIG. 1 shows a block diagram of an accumulator circuit formed by a pipeline adder and a buffer according to the present disclosure.

FIG. 1 shows a block diagram of an accumulator circuit formed by a pipeline adder and a buffer employed in hardware acceleration according to the present disclosure. GBDT histogram optimization algorithm refers to: convert feature values into bin before training, that is, dividing feature values by a piecewise function to classify the value of all samples on the feature into a certain segment (i.e., bin). The feature value is eventually converted from a continuous value to a discrete value. For example, for the case where values of the feature "age" is divided into buckets, such as divided into 5 buckets: 0-20 years old, 20-40 years old, 40-60 years old, 60-80 years old, and 80-100 years old. For any one of the buckets, such as the 20-40 years old-bucket, values of the feature "age" which belong to the range of 20-40 years are summed up to get an accumulated value x (or the average age value x after accumulation), and then the true values of the feature "age" which belong to the range of 20-40 years are replaced with x. Since there may be a plurality of features in data, and constructing histograms for the plurality of features needs to be performed separately, an accumulator circuit may be assigned to each feature to ensure that the histogram construction of all features can be performed in parallel simultaneously. However, due to the characteristics of adders and buffers, on certain hardware used for acceleration (for example, FPGA devices), each accumulation operation may cause a delay, for example, a delay of multiple clock cycles.

Figure 2:
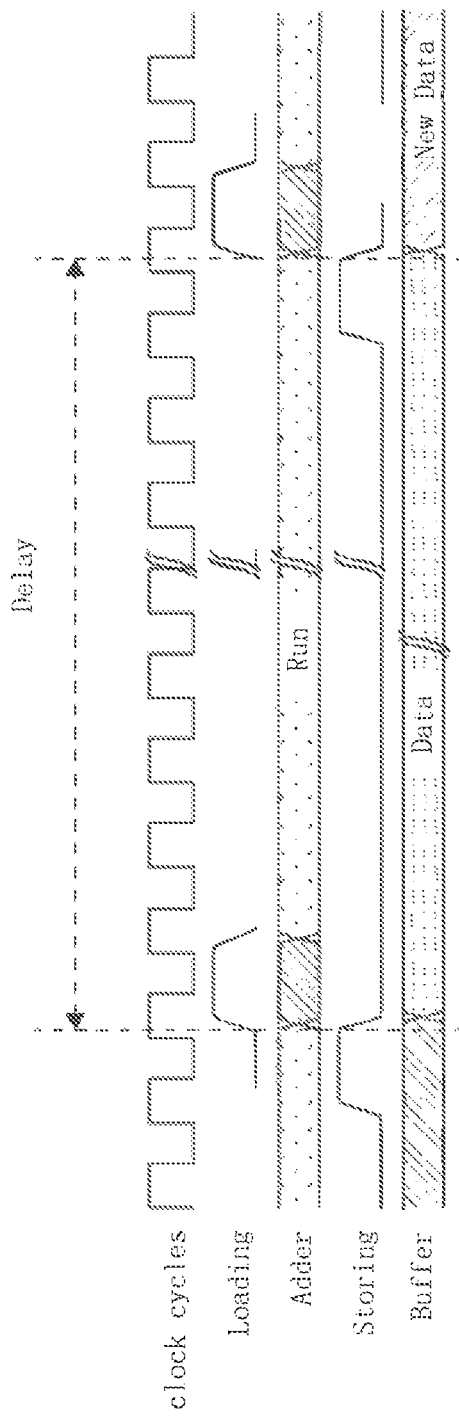
FIG. 2 shows a schematic diagram of a timing diagram of an accumulation operation performed by an accumulator circuit according to the present disclosure.

FIG. 2 shows a schematic diagram of a timing diagram of an accumulation operation performed by an accumulator circuit. Referring to FIG. 2, the adder reads data from the buffer during a loading period (loading signal of the high level), and performs an accumulation operation on the data during the following several clock cycles. When the accumulation operation is completed, the adder stores the accumulated new data in the buffer responding to a storage signal of the high level. Since the accumulated results of the previous accumulation operation have not yet been written to the buffer, resulting in the inability to perform the next accumulation operation, it is inevitable that a large amount of data dependence will be introduced, and thus the pipeline pauses. In certain cases, such delays may be as much as 14 clock cycles. In other words, the adder will be forced to pause for 13 clock cycles every time it runs for one clock cycle, resulting in a decrease in the efficiency and throughput of the pipeline. In this regard, the present disclosure further provides a scheme shown in FIG. 3.

Figure 3:
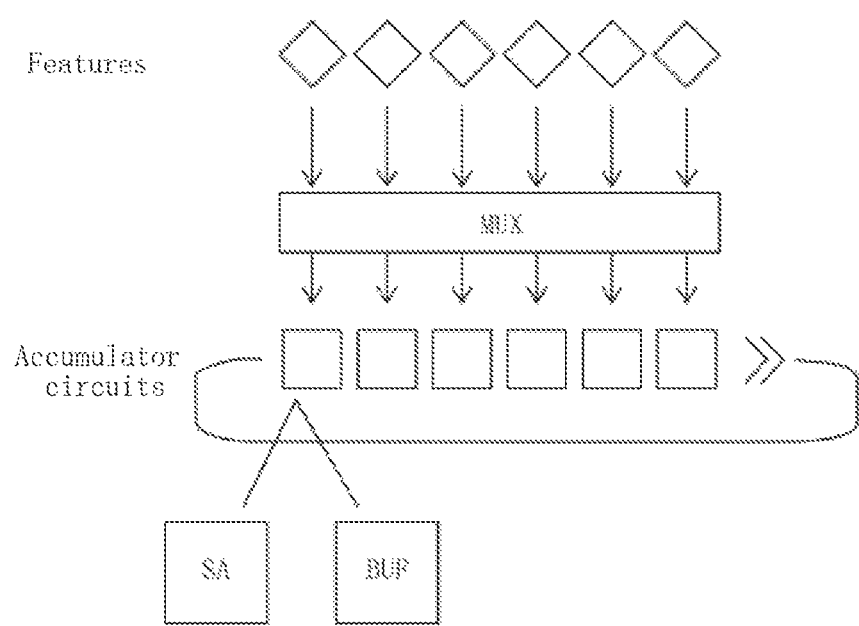
FIG. 3 shows a block diagram of a programmable device for processing a data set according to an embodiment of the present disclosure.

FIG. 3 shows a block diagram of a programmable device for processing a data set according to an embodiment of the present disclosure.

As shown in FIG. 3, the programmable device for processing a data set according to the present disclosure includes a plurality of accumulator circuits AC and a multiplexer MUX, wherein each of the accumulator circuits AC includes a pipeline adder SA and a buffer unit BUF for storing the calculation results of the pipeline adder SA. The multiplexer MUX can be configured to sequentially receive data in the data set, dynamically determine a correspondence between a plurality of features contained in the data and the plurality of accumulator circuits AC, and send feature values of the plurality of features in the received data to a corresponding accumulator circuit AC according to the correspondence. In a more particular embodiment, programmable devices may be field programmable gate arrays (FPGA).

In an embodiment, the data set may be a sampling data set for machine learning in a certain application scenario. Wherein, algorithms of the machine learning may be algorithms that need to process large amount of data and have specific requirements for precision. For example, the programmable device can be used to perform Gradient Boosting Decision Tree (GBDT) histogram algorithm processing on the sampling data set. The basic concept of the histogram algorithm is to pre-pack the feature values, such that only the histogram buckets need to be considered to select the division point when calculating the split. Compared with the pre-sorting algorithm, the histogram algorithm significantly reduces the memory consumption and helps to improve the training speed.

In the programmable device according to the present disclosure, the pipeline adder SA may operate as a pipeline circuit. In a pipeline circuit, an instruction processing pipeline is composed of multiple circuit units with different functions, and then an instruction is divided into multiple steps (for example, 4-6 steps) and the multiple steps may be executed by these circuit units respectively, so that it may be achieved that the pipeline circuit receive a new input every clock cycle. After the initial delay, the pipeline circuit may generate a new output for each clock cycle. The pipeline circuit does not reduce the time of an individual step, but greatly increases the throughput. Therefore, the utilization rate of the hardware can be increased, and thus the demand for hardware resources may be reduced.

The pipeline adder SA in each of the accumulator circuits reads an accumulated value, corresponding to a bucket to which the received feature value belongs, from a corresponding buffer unit BUF, and accumulates the received feature value to the accumulated value to obtain a new accumulated value, and update the accumulated value in the corresponding buffer unit BUF with the new accumulated value (see FIG. 2). The number of accumulator circuits may be determined by the available hardware resources, and a number of features contained in the data in the data set can be set differently according to actual situation (for example, determined by at least one of the type of data and the type of user). The programmable device may process at least one of multiple types of data and multiple types of user data through the same hardware resource (for example, the same number of accumulator circuits). In an embodiment, a number of accumulator circuits AC may be less than a number of features contained in the data in the data set. In this case, some of the accumulator circuits AC will be multiplexed. In another embodiment, the number of accumulator circuits AC may be the same as the number of features contained in the data in the data set to ensure that all features can be processed in parallel at the same time. In yet another embodiment, the number of accumulator circuits AC may be greater than the number of features contained in the data in the data set.

In an embodiment of the present disclosure, the data in the data set may include a feature label indicating a feature of the plurality of features respectively corresponding to each of the plurality of feature values of the data and a bucket label indicating a bucket corresponding to each of the plurality of feature values of the data. In this case, the pipeline adder SA in each of the accumulator circuits AC may read the accumulated value, corresponding to the bucket to which the received feature value belongs, from the corresponding buffer unit BUF according to the feature label and the bucket label corresponding to the received feature value.

In another embodiment of the present disclosure, the data in the data set may only include a bucket label indicating a bucket corresponding to each of the plurality of feature values of the data. In this case, the pipeline adder SA in each of the accumulator circuits AC may read the accumulated value, corresponding to the bucket to which the received feature value belongs, from the corresponding buffer unit BUF according to a control logic of the correspondence dynamically determined by the multiplexer and the bucket label corresponding to the received feature value.

In an embodiment, the pipeline adder SA may be a single-precision adder or a double-precision adder. It should be understood that, according to resource and accuracy requirements, various modifications can be made to the type of the pipeline adder SA without departing from the scope of the present disclosure.

The multiplexer dynamically determines the correspondence between multiple features and multiple accumulator circuits AC, which can avoid the same feature continuously fall onto the same bucket, thus avoiding/reducing the generation of data conflicts.

In an embodiment, the multiplexer MUX may dynamically determine the correspondence between the plurality of features contained in the received data and the plurality of accumulator circuits AC according to a serial number of the received data in the data set and a serial number of each of the plurality of features in the received data. This feature will then be described in more detail with reference to FIG. 4.

According to another embodiment of the present disclosure, the programmable device for processing the data set may further include an output unit (not shown). The output unit may be configured to sum up the accumulated value corresponding to the same bucket of the same feature in each buffer unit BUF in each of the plurality of accumulator circuits AC, and output a final accumulated value corresponding to each bucket of each of the plurality of features.

Figure 4:
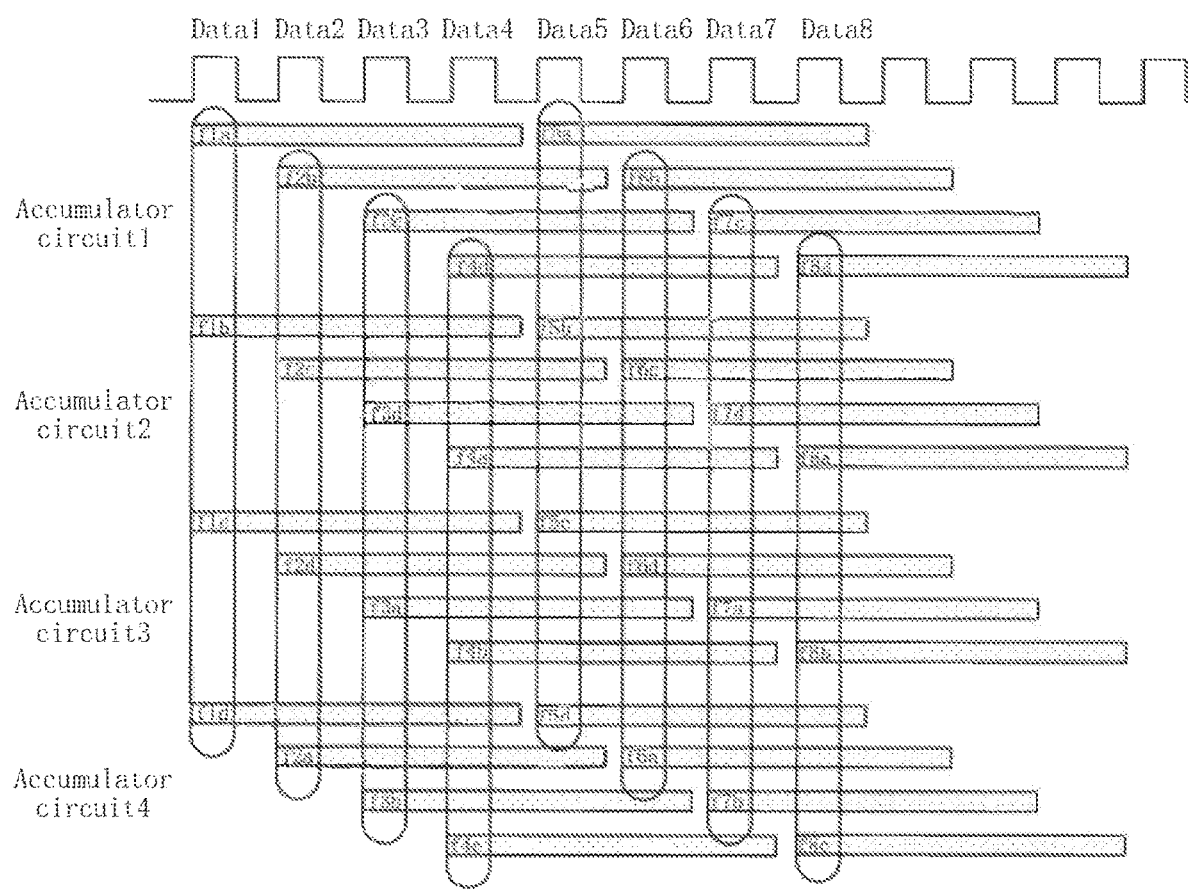
FIG. 4 shows a schematic diagram of the correspondence between the accumulator circuits of the programmable device and data features according to an embodiment of the present disclosure.

FIG. 4 shows a schematic diagram of the correspondence between the accumulator circuits AC of the programmable device and data features according to an embodiment of the present disclosure;

The following will be described in more detail below with reference to FIG. 4 to give a specific description that the multiplexer MUX dynamically determines the correspondence between the plurality of features contained in the received data and the plurality of accumulator circuits AC according to a serial number of the received data in the data set and a serial number of each of the plurality of features in the received data.

For the convenience of description, it may be assumed that: (1) the time delay of the accumulation operation of the accumulator circuits AC is 4 clock cycles (including the clock cycles for the buffer unit BUF to read data, perform accumulation, and then update the buffer unit BUF with the result of the accumulation); (2) each piece of the data contains 4 features: feature a, feature b, feature c, and feature d (for example, data 1 contains features f1a, f1b, f1c, and f1d, and data 2 contains features f2a, f2b, f2c, and f2d, and so on).

Referring to FIGS. 3 and 4, the accumulator circuits 1 to 4 are all composed of a pipeline adder SA and a buffer unit BUF. Although it takes 4 clock cycles to complete an accumulation operation, since it is a pipeline circuit, the pipeline adder SA can start processing an accumulation operation every clock without data dependence. The buffer unit BUF may be a dual-port memory that performs at most one storing operation and one loading operation in each clock cycle.

Referring to FIG. 4, in the present embodiment, since it is assumed that the number of features of the data is 4, 4 accumulator circuits (accumulator circuits 1 to 4) are provided, that is, the number of accumulator circuits is the same as the number of the features contained in the data.

The multiplexer sequentially receives data in chronological order, and each piece of data includes 4 features (for example, the features f1a, f1b, f1c, and f1d of data 1 are received in the first clock cycle in FIG. 4, and the features f2a, f2b, f2c, f2d of data 2 are received in the second clock cycle . . . ), by setting a control logic of a data selection end of the multiplexer to achieve the corresponding relationship between the features and the accumulator circuits as shown in the drawing above. In more detail, during the first clock cycle, accumulator circuit 1 corresponds to f1a, accumulator circuit 2 corresponds to f1b, accumulator circuit 3 corresponds to f1c, and accumulator circuit 4 corresponds to f1d; during the second clock cycle, accumulator circuit 1 corresponds to f2b and accumulator circuit 2 corresponds to f2c, accumulator circuit 3 corresponds to f2d, and accumulator circuit 4 corresponds to f2a . . . . In other words, whenever the serial number of data increases by 1, the serial number of the feature corresponding to the accumulator circuit moves 1 position to the left.

It should be noted that the number of accumulator circuits, the number of features, and the corresponding relationship between accumulator circuits and features described here are only for convenience of description. It is easy to understand that, depending on the specific embodiment, the number of features of the data can be more than 4, for example, 200 to 300 or more. The number of accumulator circuits can be equal to the number of features. In another embodiment, the number of accumulator circuits may be greater or less than the number of features. The correspondence between the accumulator circuit and the features can be modified according to the specific embodiment.

The control logic of the dynamic determination of the correspondence by the multiplexer MUX avoids/reduces the situation in which the accumulator circuit is re-assigned to the same feature during the accumulation of the feature values of a certain feature, thus avoiding/reducing the generation of data conflicts.

In the embodiment, the data can include feature labels and bucket labels, and the accumulator circuit reads accumulated value, corresponding to the bucket to which the received feature value belongs, from the corresponding buffer unit BUF according to the feature label and the bucket label.

In the embodiment, the data can only include bucket labels, and the accumulator circuit reads accumulated value, corresponding to the bucket to which the received feature value belongs, from the corresponding buffer unit BUF according to a control logic of a data selection end of the multiplexer and the bucket label.

Referring to FIG. 4, since each of the plurality of accumulator circuits participates in the accumulation calculation of all buckets of all features, each buffer unit BUF (one-to-one correspondence between the accumulator circuit and the buffer unit) includes all the features and their buckets. Therefore, the output unit (not shown) may sum the accumulated values of the same bucket corresponding to the same feature in the buffer units corresponding to each accumulator circuit to obtain the final accumulated value.

Figure 5:
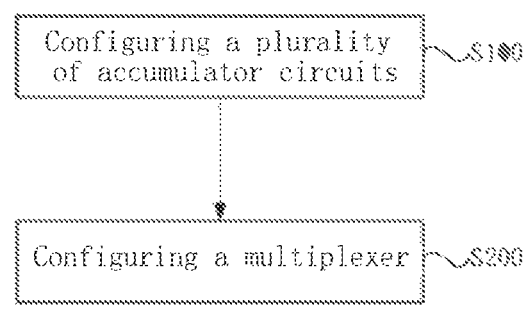
FIG. 5 shows a flowchart of a method for processing a data set according to an embodiment of the present disclosure.

FIG. 5 shows a flowchart of a method for processing a data set according to an embodiment of the present disclosure.

In an embodiment according to the present disclosure, the method for processing a data set based on a programmable device includes:

In step S100, configuring a plurality of accumulator circuits in the programmable device, wherein each of the plurality of accumulator circuits comprises a pipeline adder and a buffer unit for storing the calculation results of the pipeline adder;

In step S200, configuring a multiplexer in the programmable device, wherein the multiplexer sequentially receives data in the data set, dynamically determines a correspondence between a plurality of features contained in the data and the plurality of accumulator circuits, and, during each clock cycle, sends feature value of each of the plurality of features to a corresponding accumulator circuit according to the correspondence.

In the method according to the present disclosure, the pipeline adder is a single-precision adder or a double-precision adder.

In the method according to the present disclosure, the programmable device may be a field programmable gate array (FPGA); the data set may be a sampling data set for machine learning in a certain application scenario; the programmable device may be configured to perform Gradient Boosting Decision Tree (GBDT) histogram algorithm processing on the sampling data set. The method may set a number of the accumulator circuits to be the same as a number of the plurality of features comprised in the data in the data set, or a number of the accumulator circuits to be less or greater than a number of the plurality of features comprised in the data in the data set. The data set and programmable devices, and the relationship between the number of accumulator circuits and the number of features contained in the data described here is the same as or similar to those described with reference to FIG. 3, and therefore, redundant descriptions are omitted here.

In the method according to the present disclosure, the data includes a feature label indicating a feature of the plurality of features respectively corresponding to each of the plurality of feature values of the data and a bucket label indicating a bucket corresponding to each of the plurality of feature values of the data. The pipeline adder in each of the accumulator circuits reads the accumulated value, corresponding to the bucket to which the received feature value belongs, from the corresponding buffer unit according to the feature label and the bucket label corresponding to the received feature value.

In the method according to the present disclosure, the data may only include a bucket label indicating a bucket corresponding to each of the plurality of feature values of the data. The pipeline adder in each of the accumulator circuits reads the accumulated value, corresponding to the bucket to which the received feature value belongs, from the corresponding buffer unit according to a control logic of the correspondence dynamically determined by the multiplexer and the bucket label corresponding to the received feature value.

In an embodiment, the pipeline adder in each of the accumulator circuits is configured to read an accumulated value, corresponding to a bucket to which the received feature value belongs, from a corresponding buffer unit, and to accumulate the received feature value to the accumulated value to obtain a new accumulated value, and to update the accumulated value in the corresponding buffer unit with the new accumulated value. The pipeline adder and buffer unit described here are the same as or similar to the pipeline adder SA and buffer unit BUF described with reference to FIG. 3, and therefore, redundant descriptions are omitted here.

In an embodiment, the multiplexer may dynamically determine the correspondence between the plurality of features contained in the received data and the plurality of accumulator circuits according to a serial number of the received data in the data set and a serial number of each of the plurality of features in the received data. The multiplexer described here is the same as or similar to the multiplexer MUX described with reference to FIGS. 3 and 4, and therefore, redundant description is omitted here.

Figure 6:
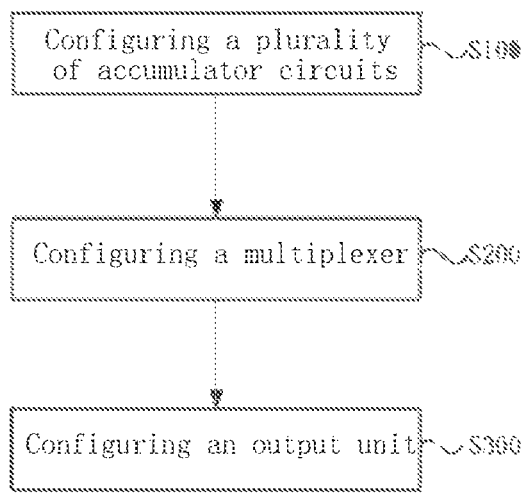
FIG. 6 shows a flowchart of a method for processing a data set according to another embodiment of the present disclosure.

FIG. 6 shows a flowchart of a method for processing a data set according to another embodiment of the present disclosure.

In addition to step S300, the method shown in FIG. 6 is substantially the same or similar to the method shown in FIG. 5, so the description of redundancy is omitted here.

In step S300, an output unit is further configured in the programmable device, wherein the output unit is configured to sum up the accumulated value corresponding to the same bucket of the same feature in each buffer unit in each of the plurality of accumulator circuits, and to output a final accumulated value corresponding to each bucket of each of the plurality of features.

In the programmable devices used to process a data set and the methods for processing a data set according to the embodiments presented in this disclosure, the pipeline adders and buffer units can be precisely controlled and used in hardware acceleration development. According to the characteristics of the machine learning algorithm, the present disclosure designs a cache usage logic suitable for the machine learning algorithm, which reduces or eliminates the possibility of data conflicts, thereby greatly improving the execution efficiency of the pipeline.

The exemplary embodiments of the present disclosure are described above. It should be understood that the foregoing description is only exemplary and not exhaustive, and the present disclosure is not limited to the disclosed exemplary embodiments. Without departing from the scope and spirit of this disclosure, many modifications and changes are obvious to ordinary technical personnel in this technical field. Therefore, the protection scope of the present disclosure should be subject to the scope of the claims.

INDUSTRIAL APPLICABILITY

In the programmable device for processing a data set and the method for processing a data set presented by the present disclosure, the multiplexer dynamically determines the correspondence between the plurality of features contained in the received data and the plurality of accumulator circuits, so as to avoid/reduce the accumulator circuit is assigned to the same feature again during the accumulation period on the feature values of a particular feature, thereby avoiding/reducing the occurrence of data conflicts.

What is claimed is:

1. A programmable device for processing a data set, comprising:
   a plurality of accumulator circuits, each of which comprises a pipeline adder and a buffer unit for storing the calculation results of the pipeline adder; and
   a multiplexer, configured to sequentially receive data in the data set, dynamically determine a correspondence between a plurality of features contained in the data and the plurality of accumulator circuits, and send feature values of the plurality of features in the received data to a corresponding accumulator circuit according to the correspondence, respectively.

2. The programmable device of claim 1, wherein the pipeline adder in each of the accumulator circuits reads an accumulated value, corresponding to a bucket to which the received feature value belongs, from a corresponding buffer unit, and accumulates the received feature value to the accumulated value to obtain a new accumulated value, and update the accumulated value in the corresponding buffer unit with the new accumulated value.

3. The programmable device of claim 2, further comprising:
an output unit, configured to sum up the accumulated value corresponding to the same bucket of the same feature in each buffer unit in each of the plurality of accumulator circuits, and output a final accumulated value corresponding to each bucket of each of the plurality of features.

4. The programmable device of claim 1, wherein, a number of the accumulator circuits is the same as a number of the plurality of features comprised in the data in the data set.

5. The programmable device of claim 1, wherein, a number of the accumulator circuits is less than a number of the plurality of features comprised in the data in the data set, or a number of the accumulator circuits is greater than a number of the plurality of features comprised in the data in the data set.

6. The programmable device of claim 1, wherein the multiplexer dynamically determines the correspondence between the plurality of features contained in the received data and the plurality of accumulator circuits according to a serial number of the received data in the data set and a serial number of each of the plurality of features in the received data.

7. The programmable device of claim 2, wherein the data comprises a feature label indicating a feature of the plurality of features respectively corresponding to each of the plurality of feature values of the data and a bucket label indicating a bucket corresponding to each of the plurality of feature values of the data;
the pipeline adder in each of the accumulator circuits reads the accumulated value, corresponding to the bucket to which the received feature value belongs, from the corresponding buffer unit according to the feature label and the bucket label corresponding to the received feature value.

8. The programmable device of claim 2, wherein the data comprises a bucket label indicating a bucket corresponding to each of the plurality of feature values of the data;
the pipeline adder in each of the accumulator circuits reads the accumulated value, corresponding to the bucket to which the received feature value belongs, from the corresponding buffer unit according to a control logic of the correspondence dynamically determined by the multiplexer and the bucket label corresponding to the received feature value.

9. The programmable device of claim 1, wherein the pipeline adder is a single-precision adder or a double-precision adder.

10. The programmable device of claim 1, wherein the data set is a sampling data set for machine learning in a certain application scenario;
the programmable device is configured to perform Gradient Boosting Decision Tree histogram algorithm processing on the sampling data set.

11. The programmable device of claim 1, wherein the programmable device is the field programmable gate array.

12. A method for processing a data set based on a programmable device, comprising:
configuring a plurality of accumulator circuits in the programmable device, wherein each of the plurality of accumulator circuits comprises a pipeline adder and a buffer unit for storing the calculation results of the pipeline adder; and
configuring a multiplexer in the programmable device, wherein the multiplexer sequentially receives data in the data set, dynamically determines a correspondence between a plurality of features contained in the data and the plurality of accumulator circuits, and, during each clock cycle, sends feature value of each of the plurality of features to a corresponding accumulator circuit according to the correspondence.

13. The method of claim 12, wherein the pipeline adder in each of the accumulator circuits is configured to read an accumulated value, corresponding to a bucket to which the received feature value belongs, from a corresponding buffer unit, and to accumulate the received feature value to the accumulated value to obtain a new accumulated value, and to update the accumulated value in the corresponding buffer unit with the new accumulated value.

14. The method of claim 13, further comprising:
configuring an output unit in the programmable device, wherein the output unit is configured to sum up the accumulated value corresponding to the same bucket of the same feature in each buffer unit in each of the plurality of accumulator circuits, and to output a final accumulated value corresponding to each bucket of each of the plurality of features.

15. The method of claim 12, wherein a number of the accumulator circuits is set to be the same as a number of the plurality of features comprised in the data in the data set.

16. The method of claim 12, wherein a number of the accumulator circuits is set to be less than a number of the plurality of features comprised in the data in the data set, or a number of the accumulator circuits is set to be greater than a number of the plurality of features comprised in the data in the data set.

17. The method of claim 12, wherein the multiplexer dynamically is configured to determine the correspondence between the plurality of features contained in the received data and the plurality of accumulator circuits according to a serial number of the received data in the data set and a serial number of each of the plurality of features in the received data.

18. The method of claim 13, wherein the data comprises a feature label indicating a feature of the plurality of features respectively corresponding to each of the plurality of feature values of the data and a bucket label indicating a bucket corresponding to each of the plurality of feature values of the data;
the pipeline adder in each of the accumulator circuits reads the accumulated value, corresponding to the bucket to which the received feature value belongs, from the corresponding buffer unit according to the feature label and the bucket label corresponding to the received feature value.

19. The method of claim 13, wherein the data comprises a bucket label indicating a bucket corresponding to each of the plurality of feature values of the data;

the pipeline adder in each of the accumulator circuits reads the accumulated value, corresponding to the bucket to which the received feature value belongs, from the corresponding buffer unit according to a control logic of the correspondence dynamically determined by the multiplexer and the bucket label corresponding to the received feature value.

20. The method of claim 12, wherein the pipeline adder is a single-precision adder or a double-precision adder.

* * * * *